United States Patent
Shim et al.

(10) Patent No.: US 7,169,641 B2
(45) Date of Patent: Jan. 30, 2007

(54) SEMICONDUCTOR PACKAGE WITH SELECTIVE UNDERFILL AND FABRICATION METHOD THERFOR

(75) Inventors: Il Kwon Shim, Singapore (SG); Sheila Marie L. Alvarez, Singapore (SG); Romeo Emmanuel P. Alvarez, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 11/121,847

(22) Filed: May 3, 2005

(65) Prior Publication Data

US 2006/0252177 A1    Nov. 9, 2006

(51) Int. Cl.
*H01L 21/00* (2006.01)
(52) U.S. Cl. .................. 438/108; 438/613
(58) Field of Classification Search ............. 438/108, 438/613; 257/778
See application file for complete search history.

(56) References Cited

U.S. PATENT DOCUMENTS

| | | | |
|---|---|---|---|
| 6,482,680 B1 | 11/2002 | Khor et al. | |
| 6,507,120 B2 | 1/2003 | Lo et al. | |
| 6,577,012 B1 | 6/2003 | Greenwood et al. | |
| 6,597,059 B1 * | 7/2003 | McCann et al. | 257/673 |
| 6,661,087 B2 | 12/2003 | Wu | |
| 2002/0031902 A1 | 3/2002 | Pendse et al. | |
| 2004/0169275 A1 | 9/2004 | Danvir et al. | |

* cited by examiner

*Primary Examiner*—Roy Karl Potter
(74) *Attorney, Agent, or Firm*—Mikio Ishimaru

(57) ABSTRACT

A method of manufacturing a semiconductor package includes providing a substrate having a plurality of contacts with solder bump contact areas that are unmasked. A plurality of underfill bumps is formed on the plurality of contacts selectively in the solder bump contact areas. A die having a plurality of solder bumps is positioned on the substrate so the plurality of solder bumps is substantially vertically aligned with the plurality of underfill bumps. The plurality of solder bumps is pressed into the plurality of underfill bumps until the plurality of solder bumps contacts the plurality of contacts. The plurality of solder bumps is reflowed. The die, the plurality of solder bumps, and the plurality of contacts are encapsulated to expose a lower surface of the plurality of contacts.

20 Claims, 3 Drawing Sheets

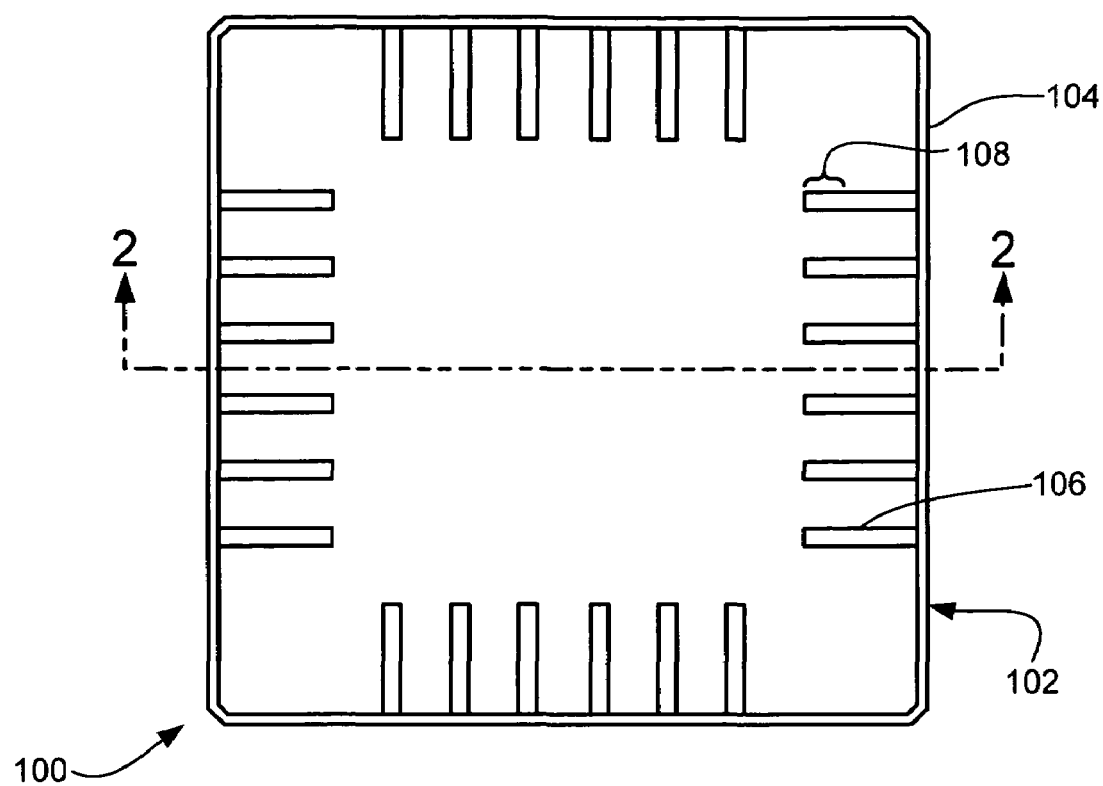
FIG. 1
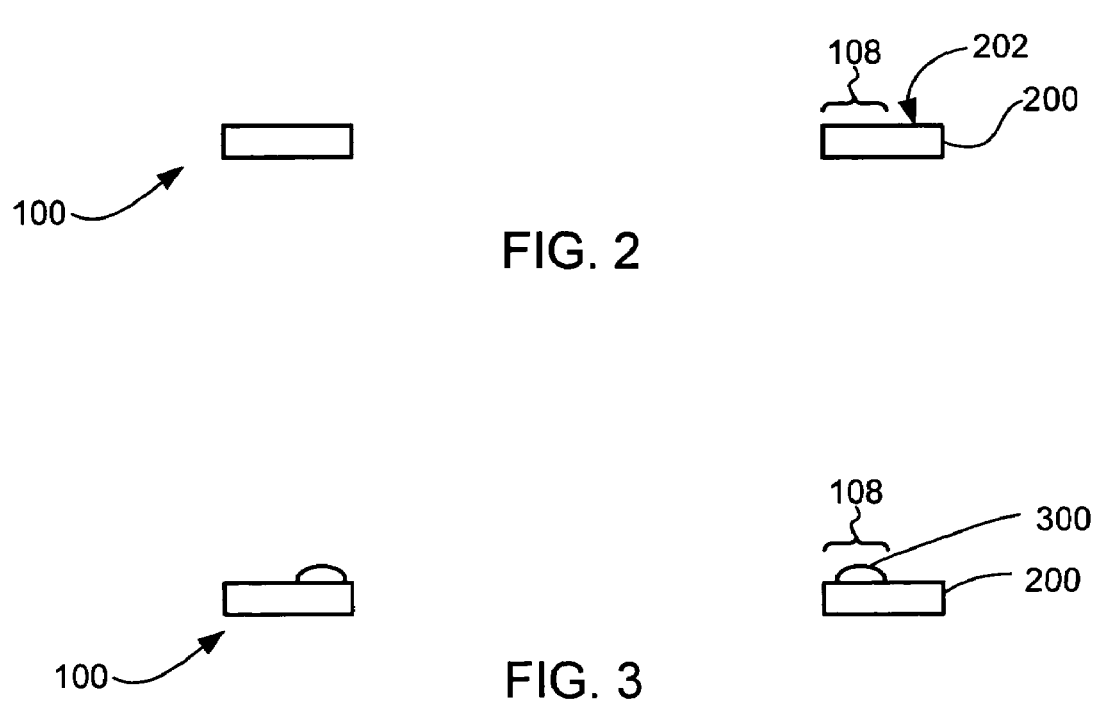
FIG. 2
FIG. 3

SEMICONDUCTOR PACKAGE WITH SELECTIVE UNDERFILL AND FABRICATION METHOD THERFOR

TECHNICAL FIELD

The present invention relates generally to semiconductors, and more particularly to a method and apparatus for manufacturing flip chip semiconductor packages.

BACKGROUND ART

Electronic products are used almost everywhere. Computers, televisions, telephones, and other electronic equipment use integrated circuits, or dies in semiconductor packages. As electronic technology has progressed, dies having more powerful functions in smaller semiconductor packages have been developed. Electronic products are increasingly light and compact due to the efficient fabrication of many types of high-density semiconductor packages. One such package is a flip chip semiconductor package.

In a flip-chip semiconductor package, bumps are formed on the bonding pads of a die. Each bump contacts a corresponding contact point on a leadframe, or other substrate, so that the die and the leadframe, or substrate, are electrically connected. Compared with conventional wire bonding and tape automated bonding (TAB) methods of joining a chip with a leadframe or substrate, the flip-chip design provides a shorter overall conductive path and hence better electrical performance in a smaller semiconductor package.

The number of bumps is heated so the number of bumps reflows to form a number of electrical connections between the die and the leadframe or substrate. During the reflow process, as the temperature is raised, the solder bumps collapse. This therefore forms a metallic compound layer between the solder bumps and the contact regions on the leads in an effort to reinforce the bonding between the solder bumps and the leads. The formation of the metallic compound is called a wetting process. However, due to the wetability of the lead frame, after the solder bumps are bonded to predetermined positions on the leads of the lead frame, the solder bumps still keep collapsing and extending outwardly to spread on the leads. This over-collapsing of the solder bumps results in cracking of the bonds, which adversely effects the electrical connection. Furthermore, the over-collapsed solder bumps also significantly decrease the height between the die and the leads. The reduced height has a detrimental effect on subsequent processes in semiconductor fabrication.

Various other methods of bump attachment and bump collapse control for flip chip on a leadframe or substrate have been in practice. In general, the other methods commonly are focused on pre-treatment of the number of lead fingers on the leadframe by laser, etching, masking, or using other wettable metals. Some make use of solder either dispensed or printed on the lead fingers. The pre-treatment of the fingers of the leadframe typically involves higher cost in leadframe manufacture by requiring additional processes that contribute to increasing the manufacturing cycle time and resulting higher yield losses.

One proposed solution involves forming a solder mask on predetermined positions of the leads, wherein the solder mask has at least one opening with a predetermined size for bonding the solder bumps thereto. This proposed solution utilizes the opening size of the solder mask for controlling the amount of collapse of the solder bumps. As the size of the opening increases, the solder bumps can extend outwardly to a greater extent; that is, the larger the collapse amount, the smaller the vertical height of the solder bumps correspondingly. Therefore, with the control in the collapse degree of the solder bumps, the height difference between the semiconductor chip and the leads can be predetermined, thus eliminating the occurrence of the over-collapsing of the solder bumps. However, the formation of the solder mask on the lead frame uses processes such as screen-printing or photolithographic patterning processes, which are quite complex and expensive.

Another proposed solution involves forming a layer of underfill material with or without a flux additive over the entire surface of the leads and positioning the solder bumps into the layer of underfill material until the solder bumps contact the leads. This solution precludes the use of an underfilling process subsequent to die attach thereby increasing the possibility of the creation of gaps or voids in the underfill material, which adversely effect the performance and reliability of the semiconductor.

Another proposed solution uses a solder alloy having a higher melting point in an attempt to control the over-collapsing of the solder bumps. However, such solder bumps generally are more expensive.

Solutions to these problems have been long sought but prior developments have not taught or suggested any solutions and, thus, solutions to these problems have long eluded those skilled in the art.

DISCLOSURE OF THE INVENTION

The present invention provides a method of manufacturing a semiconductor package that includes providing a substrate having a plurality of contacts that is unmasked. A plurality of underfill bumps is formed on the plurality of contacts selectively in the solder bump contact areas. A die having a plurality of solder bumps is positioned on the substrate so the plurality of solder bumps is substantially vertically aligned with the plurality of underfill bumps. The plurality of solder bumps is pressed into the plurality of underfill bumps until the plurality of solder bumps contacts the plurality of contacts. The plurality of solder bumps is reflowed. The die, the plurality of solder bumps, and the plurality of contacts are encapsulated to expose a lower surface of the plurality of contacts.

The present invention provides a semiconductor package without over collapsed solder bumps. Conventional semiconductor manufacturing processes are used without the need to mask the substrate or otherwise provide additional special treatment of the plurality of contacts.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 1 is a plan view of a semiconductor package at an intermediate stage of manufacture in accordance with the present invention;

FIG. 2 is a cross-sectional view of the structure of FIG. 1 taken along line 2—2;

FIG. 3 is the structure of FIG. 2 after formation of an undefill bump on a lead finger;

BEST MODE FOR CARRYING OUT THE INVENTION

Figure 4:
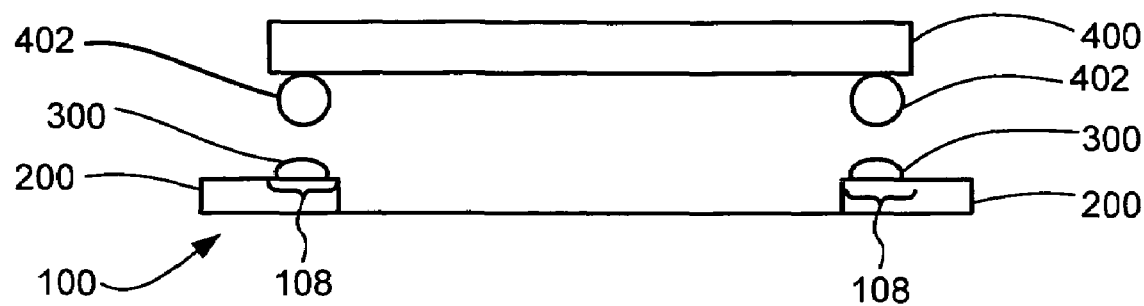
FIG. 4 is the structure of FIG. 3 with a die ready to be attached in accordance with the present invention.

In the following description, numerous specific details are given to provide a thorough understanding of the invention. However, it will be apparent that the invention may be practiced without these specific details. In order to avoid obscuring the present invention, some well-known system configurations and process steps are not disclosed in detail.

Likewise, the drawings showing embodiments of the devices are semi-diagrammatic and not to scale and, particularly, some of the dimensions are for the clarity of presentation and are shown greatly exaggerated in the FIGs. Generally, the device can be operated in any orientation. In addition/Also, where multiple embodiments are disclosed and described having some features in common, for clarity and ease of illustration and description thereof like features one to another will ordinarily be described with like reference numerals.

The term "horizontal" as used herein is defined as a plane parallel to the conventional plane or surface of the die, regardless of its orientation. The term "vertical" refers to a direction perpendicular to the horizontal as just defined. Terms, such as "on", "above", "below", "bottom", "top", "side", "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a plan view of a semiconductor package 100 at an intermediate stage of manufacture in accordance with the present invention. The semiconductor package includes a leadframe 102, or other suitable substrate. It will be apparent to those skilled in the art upon a reading of this disclosure that the leadframe 102 can be any electrical substrate upon which a semiconductor device is mounted using solder balls or bumps. Typically, the substrate includes at least one of a leadframe, a printed wiring board, a flame-retardant fiberglass (FR4) board, an organic circuit board, a ceramic substrate, a hybrid circuit substrate, an integrated circuit package, a semiconductor substrate, a polyimide tape, a flex circuit, a high-density interconnect board, an electronic module, and combinations thereof.

The leadframe 102 has an outer frame 104 and a number of lead fingers 106. The number of lead fingers 106 extends inwardly from the outer frame 104. The number of lead fingers 106 has a number of solder bump contact areas 108. The leadframe 102 typically is made of a conductive material, such as copper.

Referring now to FIG. 2, therein is shown a cross-sectional view of the structure of FIG. 1 taken along line 2—2. The lead finger 200 is representative of the number of lead fingers 106 shown in FIG. 1. The lead finger 200 has an upper surface 202.

Referring now to FIG. 3, therein is shown the structure of FIG. 2 after selective formation of an underfill bump 300 on the upper surface 202 of the lead finger 200 in the number of solder bump contact areas 108 on the lead finger 200. The underfill bump 300 is substantially the same size as the solder bump 402 shown in FIG. 4 to be attached to the lead finger 200. The underfill bump 300 is formed on the lead finger 200 using conventional semiconductor manufacturing equipment. Typically, the underfill bump 300 is formed using at least one of a dispensing process, a printing process, and combinations thereof. Additionally, the solder bump 402 shown in FIG. 4 can be dipped into the underfill material used to form the underfill bump 300. Preferably, dipping the solder bump 402 into the underfill material contacts the tip of the solder bump 402 but covers less than or equal to about one-third of the height of the solder bump 402.

The underfill bump 300 typically is at least one of a polymer, an epoxy, a polymer flux, an epoxy flux, and combinations thereof. The underfill bump 300 is uncured or partially cured so that that the underfill bump 300 softens when heated therefore requiring no holes or openings in the underfill bump 300 prior to attachment of a die as discussed below.

Typically, the epoxy/polymer flux should have a viscosity low enough to allow deposition by printing or dispensing on the lead finger 200, or dipping the number of solder bumps 402 shown in FIG. 4, but a high enough viscosity to prevent the epoxy/polymer flux from flowing beyond the upper surface of the lead finger 200.

It has been discovered that an epoxy/polymer flux having a viscosity from about 2500 cps to about 10000 cps meets these requirements. Additionally, the epoxy/polymer flux material typically has a coefficient of thermal expansion that substantially matches that of the encapsulant 500 shown in FIG. 5A and FIG. 5B below.

Referring now to FIG. 4, therein is shown the structure of FIG. 3 with a die 400 ready to be attached in accordance with the present invention. The die 400 has a number of solder bumps 402 formed on the lower surface of the die 400. The number of solder bumps 402 is at least one of a leaded solder, eutectic, lead-free alloy, and combinations thereof. The number of solder bumps 402 may be formed, for example, by electroplating one or more metals such as lead and tin to form a lead-tin solder bump. The number of solder bumps 402 also may be formed by depositing layers of one or more metals on an interconnection surface of the die and using conventional photolithographic techniques to pattern and etch any undesired metal. The number of solder bumps 402 also may be heat treated to melt the number of solder bumps 402 to form a rounded shape. Alternatively, the number of bumps 402 may be formed by positioning solder balls or bumps on the contact pads (not shown) of the die 400 and heating the solder balls or bumps to adhere them to the contact pads of the die 400. Alternatively, the number of solder bumps 402 may be formed by selectively screen printing solder paste on the contact pads on the die 400, and then heating the die 400 to melt the solder paste and form the number of solder bumps 402.

Figure 5A:
FIG. 5A is the structure of FIG. 4 after die attachment and encapsulating the die to form the semiconductor package.

Referring now to FIG. 5A, therein is shown FIG. 5 is the structure of FIG. 4 after die attachment and encapsulating the die 400 to form the semiconductor package. The die 400 is placed on the lead fingers 200 using a conventional die pick and place process. The number of solder bumps 402 on the lower surface of the die 400 typically is dipped in a flux to produce a perimeter of wettable area on the number of solder bumps 402. The flux also may be sprayed or otherwise applied to the number of solder bumps 402.

Figure 5B:
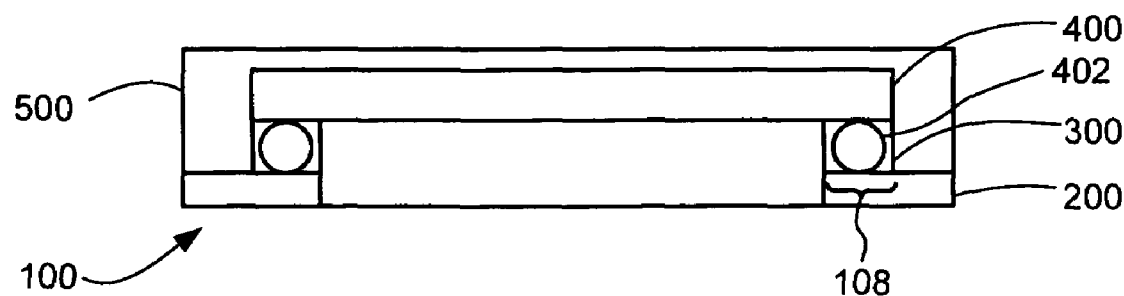
FIG. 5B is the structure of FIG. 4 after die attachment and encapsulating the die to form the semiconductor package in accordance with an alternative embodiment of the present invention.

The number of solder bumps 402 is pressed into the underfill bump 300 using, for example, a heating process and/or a scrubbing motion. The number of solder bumps 402 displaces a centrally located portion of the underfill bump 300 until the number of solder bumps 402 contacts the upper surface 202 of the lead fingers 200. The underfill bump 300 surrounds a base portion of the number of solder bumps 402 when the underfill bump 300 is displaced by the number of solder bumps 402, or envelops the diameter of the number of solder bumps 402 as shown in FIG. 5B.

The number of solder bumps 402 is reflowed by heating to form an interconnection between the die 400 and the lead fingers 200. The assembled die 400 and leadframe 102 is heated, such as by using at least one of an infrared, convective, forced-air, and combinations thereof, furnace to heat the number of solder bumps 402 to form an electrical connection between the number of solder bumps 402 and the lead fingers 200. The number of solder bumps 402 melt and become soldered to the leads fingers 200. The number of underfill bumps 300 softens and flow around the number of solder bumps 402. Alternatively, the number of solder bumps 402 may be locally heated and pressed against the lead fingers 200 to displace the underfill bumps around the number of solder bumps 402, and to reflow the number of solder bumps 402. As discussed above with reference to FIG. 3, the number of solder bumps 402 may be dipped in the epoxy/polymer flux to produce a wettable area on the number of solder bumps 402.

An encapsulant 500 is formed over the die 400, the number of solder bumps 402, and the lead fingers 200 using a molding compound, such as an epoxy or other suitable material.

It has been discovered that the use of the selectively positioned underfill bumps 300 on the lead fingers 200 in a projected contact area provides a restrictive coating around the in number of solder bumps 402 to prevent the number of solder bumps 402 from spreading over the lead fingers 200. Over-collapsing of the number of solder bumps 402 is thereby prevented. Extra processes such as masking and laser etching to prepare the lead fingers 200 are avoided. Additionally, conventional molding and encapsulating processes can still be used.

Figure 6:
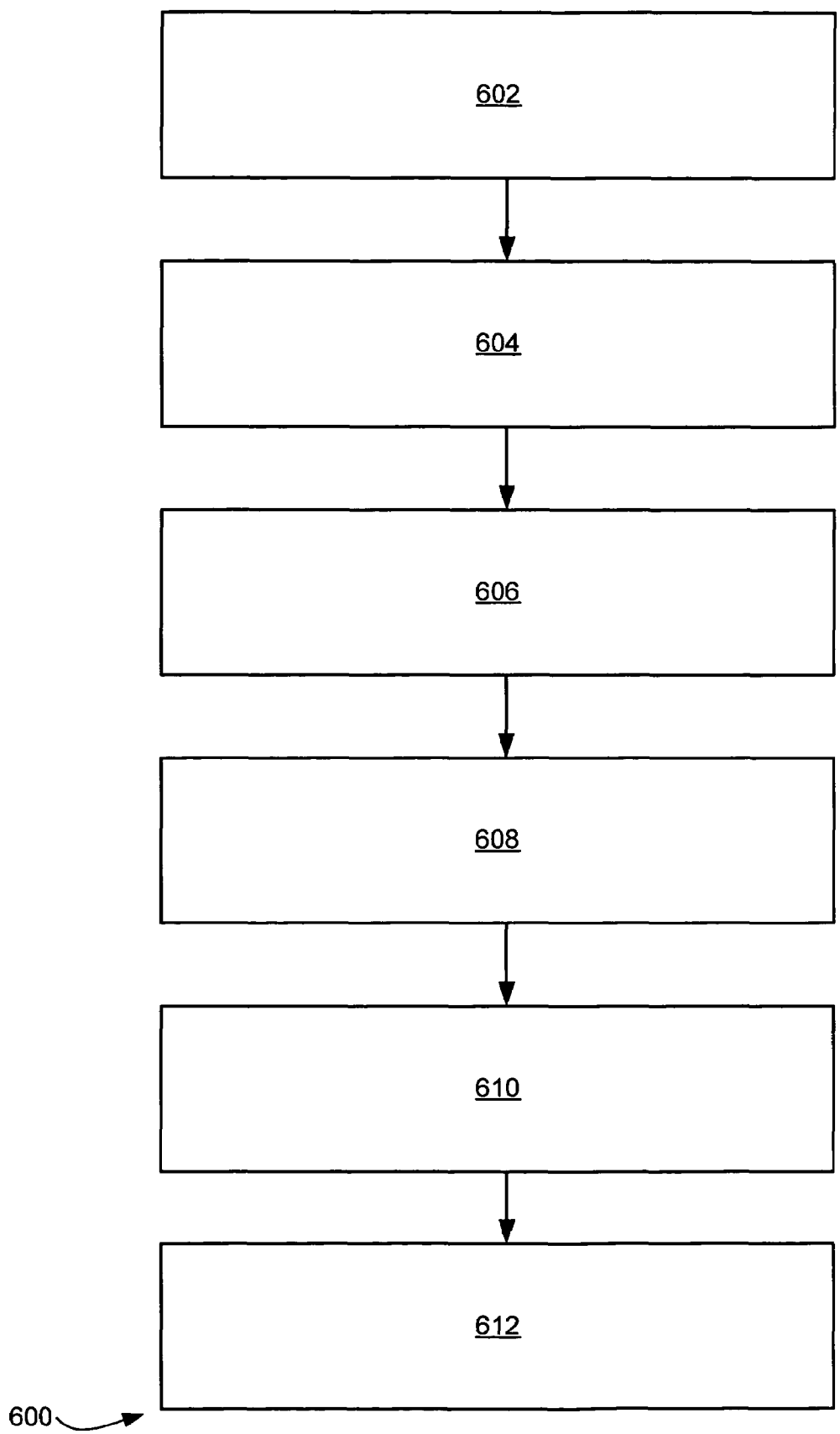
FIG. 6 is a flow chart of a method for manufacturing a semiconductor package in accordance with the present invention.

Referring now to FIG. 6, therein is shown a flow chart of a method 600 for manufacturing a semiconductor package in accordance with the present invention. The method 600 includes providing a substrate having an plurality of contacts with solder bump contact areas that are unmasked in a block 602; selectively forming a plurality of underfill bumps on the plurality of contacts in the solder bump contact areas in a block 604; positioning a die having a plurality of solder bumps on the substrate so the plurality of solder bumps is substantially vertically aligned with the plurality of underfill bumps in a block 606; pressing the plurality of solder bumps into the plurality of underfill bumps until the plurality of solder bumps contacts the plurality of contacts in a block 608; reflowing the plurality of solder bumps in a block 610; and encapsulating the die, the plurality of solder bumps, and the plurality of contacts to expose a lower surface of the plurality of contacts in a block 612.

Thus, it has been discovered that the method and apparatus of the present invention furnish important and heretofore unavailable solutions, capabilities, and functional advantages for semiconductor manufacturing. The resulting process and configurations are straightforward, economical, uncomplicated, highly versatile, and effective, use conventional technologies, and are thus readily suited for manufacturing semiconductor devices that are fully compatible with conventional manufacturing processes and technologies.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. A method of manufacturing a semiconductor package, comprising:
   providing a substrate having a plurality of contacts with solder bump contact areas that are unmasked;
   selectively forming a plurality of underfill bumps on the plurality of contacts in the solder bump contact areas;
   positioning a die having a plurality of solder bumps on the substrate so the plurality of solder bumps is substantially vertically aligned with the plurality of underfill bumps;
   pressing the plurality of solder bumps into the plurality of underfill bumps until the plurality of solder bumps contacts the plurality of contacts;
   reflowing the plurality of solder bumps; and
   encapsulating the die, the plurality of solder bumps, and the plurality of contacts to expose a lower surface of the plurality of contacts.

2. The method of manufacturing a semiconductor package as claimed in claim 1, wherein:
   selectively forming a plurality of underfill bumps on the plurality of contacts in the solder bump contact areas uses at least one of a polymer, an epoxy, a polymer flux, an epoxy flux, and combinations thereof.

3. The method of manufacturing a semiconductor package as claimed in claim 1, wherein:
   selectively forming a plurality of underfill bumps on the plurality of contacts in the solder bump contact areas uses at least one of dispensing an underfill material containing flux, printing an underfill material containing flux, dipping the plurality of solder bumps into an underfill material containing flux, and combinations thereof.

4. The method of manufacturing a semiconductor package as claimed in claim 1, further comprising:
   coating the plurality of solder bumps with a flux; and
   positioning the plurality of solder bumps into the plurality of underfill bumps.

5. The method of manufacturing a semiconductor package as claimed in claim 1, wherein:
   providing a substrate having a plurality of contacts provides a leadframe having a plurality of lead fingers; and
   forming a plurality of underfill bumps on the plurality of contacts forms a plurality of underfill bumps on the plurality of lead fingers.

6. A method of manufacturing a semiconductor package, comprising:
   providing a leadframe having a plurality of lead fingers with solder bump contact areas that are unmasked;
   forming a plurality of underfill bumps on the plurality of lead fingers selectively in the solder bump contact areas;

positioning a die having a plurality of solder bumps on the leadframe so the plurality of solder bumps is substantially vertically aligned with the plurality of underfill bumps;

pressing the plurality of solder bumps into the plurality of underfill bumps until the plurality of solder bumps contacts the plurality of lead fingers;

reflowing the plurality of solder bumps; and encapsulating the die, the plurality of solder bumps, and the plurality of lead fingers to expose a lower surface of the plurality of lead fingers.

7. The method of manufacturing a semiconductor package as claimed in claim 6, wherein:

selectively forming a plurality of underfill bumps on the plurality of leads in the solder bump contact areas uses at least one of a polymer, an epoxy, a polymer flux, an epoxy flux, and combinations thereof.

8. The method of manufacturing a semiconductor package as claimed in claim 6, wherein:

selectively forming a plurality of underfill bumps on the plurality of lead fingers in the solder bump contact areas uses at least one of dispensing an underfill material containing a flux, printing an underfill material containing a flux, dipping the plurality of solder bumps into an underfill material containing flux, and combinations thereof.

9. The method of manufacturing a semiconductor package as claimed in claim 6, further comprising:

coating the plurality of solder bumps with a flux; and positioning the plurality of solder bumps into the plurality of underfill bumps.

10. The method of manufacturing a semiconductor package as claimed in claim 6, wherein:

positioning a die having a plurality of solder bumps positions a die having at least one of leaded solder bumps, eutectic solder bumps, lead-free alloy solder bumps, and combinations thereof.

11. A semiconductor package, comprising:

a substrate having a plurality of contacts with solder bump contact areas;

a plurality of underfill bumps on the plurality of contacts selectively in the solder bump contact areas;

a die having a plurality of solder bumps;

the plurality of solder bumps positioned on the plurality of underfill bumps; and an encapsulant over the die, the plurality of solder bumps, and the plurality of contacts exposing a lower surface of the plurality of contacts.

12. The semiconductor package as claimed in claim 11, wherein:

the plurality of underfill bumps on the plurality of contacts with solder bump contact areas comprises at least one of a polymer, an epoxy, a polymer flux, an epoxy flux, and combinations thereof.

13. The semiconductor package as claimed in claim 11, wherein:

the plurality of underfill bumps on the plurality of contacts with solder bump contact areas is at least one of dispensed, printed, and combinations thereof.

14. The semiconductor package as claimed in claim 11, further comprising:

a flux coating the plurality of solder bumps; and wherein the plurality of solder bumps is positioned into the plurality of underfill bumps.

15. The semiconductor package as claimed in claim 11, wherein:

the substrate having a plurality of contacts with solder bump contact areas comprises a leadframe having a plurality of lead fingers with solder bump contact areas; and the plurality of underfill bumps on the plurality of contacts in the solder bump contact areas comprises a plurality of underfill bumps on the plurality of lead fingers in the solder bump contact areas.

16. A semiconductor package, comprising:

a leadframe having a plurality of lead fingers with solder bump contact areas;

a plurality of underfill bumps on an upper surface of the plurality of lead fingers selectively in the solder bump contact areas;

a die having a plurality of solder bumps;

the plurality of solder bumps positioned into the plurality of underfill bumps; and an encapsulant over the die, the plurality of solder bumps, and the leadframe to expose a lower surface of the plurality of lead fingers.

17. The semiconductor package as claimed in claim 16, wherein:

the plurality of underfill bumps on the plurality of lead fingers with solder bump contact areas comprise at least one of a polymer, an epoxy, a polymer flux, an epoxy flux, and combinations thereof.

18. The semiconductor package as claimed in claim 16, wherein:

the plurality of underfill bumps on the plurality of lead fingers with solder bump contact areas is at least one of dispensed, printed, solder bump dipped, and combinations thereof.

19. The semiconductor package as claimed in claim 16, further comprising:

a flux coating the plurality of solder bumps; and wherein the plurality of solder bumps is positioned into the plurality of underfill bumps.

20. The method of manufacturing a semiconductor package as claimed in claim 16, wherein:

the plurality of solder bumps comprises at least one of a leaded solder, a eutectic, a lead-free alloy solder, and combinations thereof.

* * * * *